US012738945B2

(12) United States Patent
Kim

(10) Patent No.: US 12,738,945 B2
(45) Date of Patent: Sep. 15, 2026

(54) DIGITALLY CALIBRATED PROGRAMMABLE CLOCK PHASE GENERATION CIRCUIT

(71) Applicant: AyDeeKay LLC, Aliso Viejo, CA (US)

(72) Inventor: Robert W Kim, Aliso Viejo, CA (US)

(73) Assignee: Ay Dee Kay LLC, Aliso Viejo, CA (US)

(*) Notice: Subject to any disclaimer, the term of this patent is extended or adjusted under 35 U.S.C. 154(b) by 135 days.

(21) Appl. No.: 18/909,930

(22) Filed: Oct. 8, 2024

(65) Prior Publication Data

US 2025/0030425 A1 Jan. 23, 2025

Related U.S. Application Data

(63) Continuation of application No. 18/376,420, filed on Oct. 3, 2023, now Pat. No. 12,136,924, which is a continuation of application No. 18/126,889, filed on Mar. 27, 2023, now Pat. No. 11,831,322, which is a continuation of application No. 17/555,840, filed on Dec. 20, 2021, now Pat. No. 11,641,206.

(Continued)

(51) Int. Cl.

*H03L 7/081* (2006.01)
*H03L 7/099* (2006.01)
*H03M 1/10* (2006.01)

(52) U.S. Cl.

CPC .......... *H03L 7/0814* (2013.01); *H03L 7/0995* (2013.01); *H03M 1/1061* (2013.01)

(58) Field of Classification Search

CPC .. H03L 7/0814; H03L 7/0995; H03M 1/1061; H03K 5/131; H03K 5/1565; H03K 3/0315

See application file for complete search history.

(56) References Cited

U.S. PATENT DOCUMENTS 5,166,959 A * 11/1992 Chu .................. G01R 29/0273 377/56
5,859,549 A * 1/1999 Shuholm ................ H03L 7/183 327/156

(Continued)

FOREIGN PATENT DOCUMENTS

KR 101851215 B1 4/2018

OTHER PUBLICATIONS

PCT Patent Appl. No. PCT/US21/64746, International Search Report and Written Opinion, Mar. 9, 2022.

*Primary Examiner* — Adam D Houston
(74) *Attorney, Agent, or Firm* — Steven Stupp

(57) ABSTRACT

An integrated circuit that includes a generating circuit is described. During operation, the generating circuit may provide an edge clock having a target phase within a clock period of an input clock, where the generating circuit does not include a delay-locked loop (DLL). For example, the generating circuit may include a gated ring oscillator that provides a reference clock having a first fundamental frequency that is larger than a second fundamental frequency of the input clock. Note that the gated ring oscillator may be programmable to adjust the first fundamental frequency within a predefined range of values. Moreover, the generating circuit may include a control circuit that determines a reference count of a number of edges of the reference clock within a reference period of the reference clock.

20 Claims, 6 Drawing Sheets

Related U.S. Application Data

(60) Provisional application No. 63/134,955, filed on Jan. 7, 2021.

(56) References Cited

U.S. PATENT DOCUMENTS 6,359,519 B1 * 3/2002 Farrow ................ H03K 3/0315 331/25
7,091,763 B1 * 8/2006 Johnson .................... H03L 7/07 327/175
7,266,595 B1 * 9/2007 Black .................. H04L 43/0811 715/744
7,352,297 B1 * 4/2008 Rylyakov .............. H03M 7/165 331/25
7,577,231 B2 * 8/2009 Pomichter, Jr. ........... G06F 1/08 327/116
7,733,151 B1 * 6/2010 Yu ........................ H03K 5/1565 327/156
7,888,981 B2 2/2011 Yamakido et al.
8,138,843 B2 * 3/2012 Straayer ............... H03K 3/0315 368/118
8,558,728 B1 10/2013 Lemkin et al.
8,564,471 B1 * 10/2013 Gao ...................... G04F 10/005 341/166
8,669,896 B2 * 3/2014 Tsai ...................... H03M 1/462 377/76
8,803,574 B2 * 8/2014 McLeod ................... H03L 7/23 327/147
9,577,659 B2 2/2017 Yoshioka et al.
9,685,141 B2 * 6/2017 Song ...................... H03K 5/135
9,698,807 B1 * 7/2017 Caffee ................. H03M 1/1033
9,971,312 B1 * 5/2018 Hailu .................... G04F 10/005
10,018,970 B2 * 7/2018 Chuang ................. G04F 10/005
10,044,359 B1 * 8/2018 Kim ...................... H03L 7/0995
10,630,272 B1 * 4/2020 Ashtiani .................. H03K 5/12
10,826,501 B1 * 11/2020 Coban ................... H03L 7/0995
11,239,853 B1 * 2/2022 Dai ....................... H03M 1/804
11,424,736 B1 * 8/2022 Bowman ................ H03K 19/20
12,407,353 B1 * 9/2025 Lin ......................... H03L 7/093
2002/0113660 A1 * 8/2002 Dally .................... H03L 7/0818 331/135
2003/0155981 A1 * 8/2003 Dey ..................... H03D 13/004 331/16
2006/0238262 A1 * 10/2006 Opris ........................ H03L 7/18 331/16
2010/0020910 A1 * 1/2010 Bhagavatheeswaran .................... H03L 7/0891 375/376
2012/0098604 A1 * 4/2012 Lee ........................ H03K 3/011 331/57
2012/0182054 A1 * 7/2012 Sabapathy ........... H03K 3/0315 327/172
2012/0319747 A1 * 12/2012 Namdar-Mehdiabadi ................... H03L 7/095 327/149
2013/0027102 A1 * 1/2013 Chen ..................... H03L 7/0995 327/158
2013/0129035 A1 * 5/2013 Sabapathy ........... H03K 3/0315 377/25
2013/0278453 A1 * 10/2013 Steensgaard-Madsen ................... H03M 1/201 341/110
2015/0077279 A1 * 3/2015 Song ..................... G04F 10/005 341/155
2015/0220065 A1 * 8/2015 Suma Vinay ........... G04F 10/04 341/166
2016/0173075 A1 * 6/2016 Tanihira ............. H03K 5/15026 327/295
2016/0238998 A1 8/2016 Pavlovic et al.
2018/0088535 A1 * 3/2018 Wang .................... G04F 10/005
2018/0115410 A1 * 4/2018 Tajalli ................... H03L 7/0998
2019/0004562 A1 * 1/2019 Gupta .................. H03K 3/0315
2019/0052280 A1 * 2/2019 Perez .................... H03L 7/0997
2019/0064749 A1 * 2/2019 Sudo ..................... H03L 7/0996
2021/0021271 A1 * 1/2021 Chen ......................... H03L 7/07
2022/0170986 A1 * 6/2022 Nayak .............. G01R 31/31725
2022/0216877 A1 * 7/2022 Kim ..................... H03K 5/1565

* cited by examiner

DIGITALLY CALIBRATED PROGRAMMABLE CLOCK PHASE GENERATION CIRCUIT

CROSS REFERENCE TO RELATED APPLICATIONS

This application is a continuation of U.S. patent application Ser. No. 18/376,420, "Digitally Calibrated Programmable Clock Phase Generation Circuit," filed on Oct. 3, 2023, by Robert W. Kim, which is a continuation of U.S. patent application Ser. No. 18/126,889, "Digitally Calibrated Programmable Clock Phase Generation Circuit," filed on Mar. 27, 2023, by Robert W. Kim, which is a continuation of U.S. patent application Ser. No. 17/555,840, "Digitally Calibrated Programmable Clock Phase Generation Circuit," filed on Dec. 20, 2021, by Robert W. Kim (now U.S. patent Ser. No. 11/641,206), which claims priority under 35 U.S.C. 119 (c) to U.S. Provisional Application Ser. No. 63/134,955, entitled "Digitally Calibrated Programmable Clock Phase Generation Circuit," by Robert W. Kim, filed on Jan. 7, 2021, the contents of each of which are herein incorporated by reference.

FIELD

The present disclosure relates to a generating circuit that provides one or more edge clocks within a clock period of an input clock using a digital circuit and without using a delay-locked loop (DLL).

BACKGROUND

A successive-approximation-register (SAR) analog-to-digital converters (ADC) often uses multiple clock reference phases within a sampling clock cycle. For example, the SAR ADC may use target signals and tracking signals based on an asymmetric clock (such as a clock having a duty cycle other than 50% or 50/50) to divide up an input clock.

Typically, complicated analog circuits are often used to generate edges within the period of the input clock. For example, a DLL may be used to generate multiple clock edges in a period of the input clock, such as 8, 16 or 32 clock edges. Moreover, combination logic (such as set/reset latches) may be used to generate additional delayed edges that track the input clock edges. However, as process nodes are reduced to smaller critical dimensions, the analog circuits used in the DLL usually do not scale well.

SUMMARY

Embodiments of an integrated circuit are described. This integrated circuit includes a generating circuit. During operation, the generating circuit provides an edge clock having a target phase within a clock period of an input clock, where the generating circuit does not include a DLL.

For example, the generating circuit may include a gated ring oscillator that provides a reference clock having a first fundamental frequency that is larger than a second fundamental frequency of the input clock.

Note that the gated ring oscillator may be programmable to adjust the first fundamental frequency within a predefined range of values.

Moreover, the generating circuit may include a control circuit that determines a reference count of a number of edges of the reference clock within a reference period of the reference clock. This control circuit may provide a control signal corresponding to the target phase based at least in part on a predefined sub-count of the reference count. Note that the predefined sub-count may be programmable or adjustable. Furthermore, the predefined sub-count may be computed by the control circuit by digitally dividing the reference count by a predefined value. Additionally, based at least in part on the control signal, the generating circuit may provide the edge clock having the target phase and a duty cycle. In some embodiments, the duty cycle may be other than 50/50 and may be provided by selectively turning the gated ring oscillator on and off based at least in part on the control signal.

Note that the generating circuit may concurrently generate multiple edge clocks having different target phases in the clock period.

Moreover, the generating circuit may be periodically calibrated.

Furthermore, the integrated circuit may include a second generating circuit, and the generating circuit and the second generating circuit may be alternately calibrated and operated in a normal operating mode.

Additionally, the integrated circuit may include an ADC that uses the edge clock to convert a second input signal into a quantized output. In some embodiments, the ADC may include a SAR ADC.

Another embodiment provides an electronic device that includes the generating circuit or the integrated circuit.

Another embodiment provides a system that includes the generating circuit or the integrated circuit.

Another embodiment provides a method for providing an edge clock. This method includes at least some of the operations performed by the generating circuit.

This Summary is provided for purposes of illustrating some exemplary embodiments, so as to provide a basic understanding of some aspects of the subject matter described herein. Accordingly, it will be appreciated that the above-described features are examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF DRAWINGS

Note that like reference numerals refer to corresponding parts throughout the drawings. Moreover, multiple instances of the same part are designated by a common prefix separated from an instance number by a dash.

DETAILED DESCRIPTION

An integrated circuit that includes a generating circuit is described. During operation, the generating circuit may provide an edge clock having a target phase within a clock period of an input clock, where the generating circuit does not include a DLL. For example, the generating circuit may include a gated ring oscillator that provides a reference clock having a first fundamental frequency that is larger than a second fundamental frequency of the input clock. Note that the gated ring oscillator may be programmable to adjust the first fundamental frequency within a predefined range of values. Moreover, the generating circuit may include control circuit that determines a reference count of a number of edges of the reference clock within a reference period of the reference clock. This control circuit may provide a control signal corresponding to the target phase within a clock period of the input clock based at least in part on a predefined sub-count of the reference count. Then, based at least in part on the control signal, the generating circuit may provide the edge clock having the target phase and a duty cycle. In some embodiments, the duty cycle may be other than 50/50 and may be provided by selectively turning the gated ring oscillator on and off based at least in part on the control signal.

By providing the edge clock without using a DLL, these circuit techniques may allow the generating circuit to be scaled to smaller critical dimensions. Moreover, because the generating circuit does not include a DLL, the generating circuit may respond more rapidly. Furthermore, the generating circuit may improve the performance of an ADC, e.g., at smaller critical dimensions. Consequently, the generating circuit and/or the ADC may be used in a wide variety of systems, electronic devices and applications.

We now describe embodiments of the circuit techniques and the generating circuit. In the disclosed circuit techniques, edges may be generated using one or more digital circuit(s). For example, an all-digital calibrated-delay generating circuit may only use digital standard cells. Thus, the generating circuit may not include a DLL.

Figure 1:
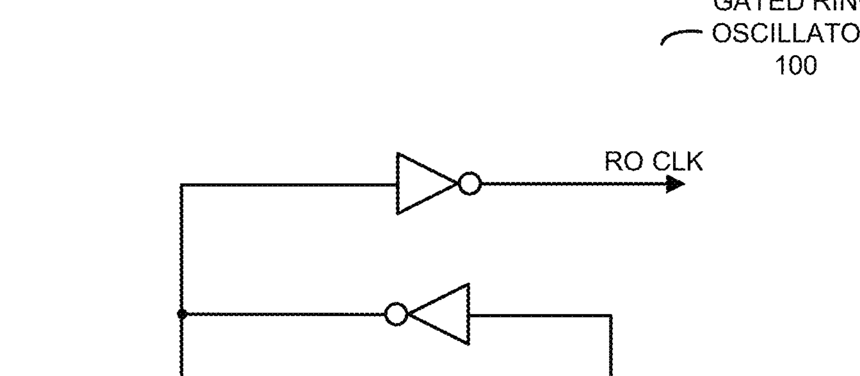
FIG. 1 is a block diagram illustrating an example of a gated ring oscillator according to some embodiments of the present disclosure.

In the calibrated-delay generating circuit, a gated ring oscillator (which is a ring oscillator that can be gated on or off) may be used to generate a reference clock having a larger fundamental frequency than an input clock. For example, the input clock may have a fundamental frequency of 100 MHz. FIG. 1 presents a block diagram illustrating an example of gated ring oscillator 100 according to some embodiments of the present disclosure. Notably, gated ring oscillator 100 may provide a reference oscillator (RO) clock (which is sometimes referred to as a 'reference clock') and may be gated using an enable signal.

Figures 2, 3:
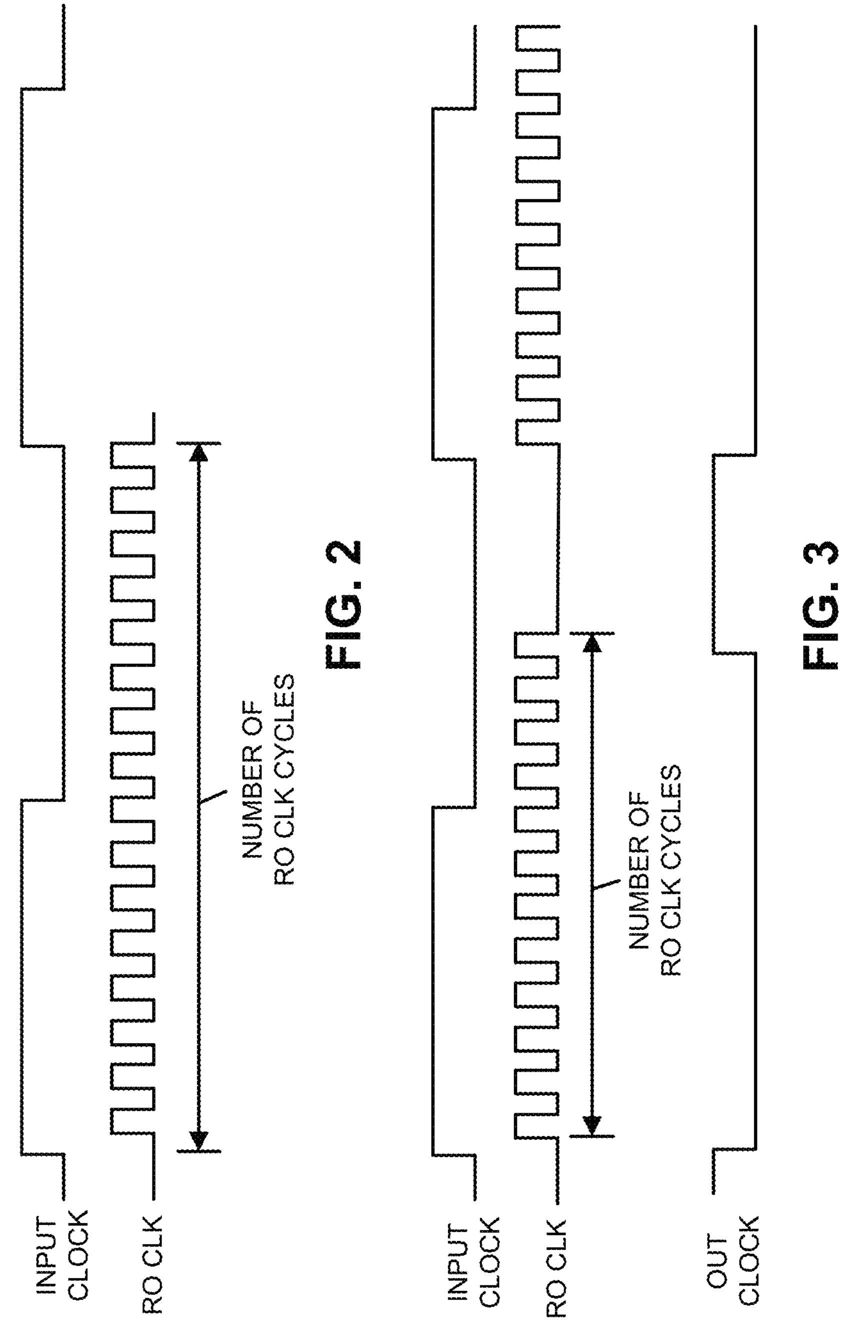
FIG. 2 is a drawing illustrating an example of counting the number of reference clock cycles in an input clock cycle during calibration according to some embodiments of the present disclosure.
FIG. 3 is a drawing illustrating an example of counting the number of reference clock cycles in an input clock cycle during calibration with a reference clock having a 75/25 duty cycle according to some embodiments of the present disclosure.

Then, the number of higher-frequency clock edges that pass or occur within a reference clock period of the reference clock may be counted and recorded or stored (e.g., in a non-volatile memory) as a reference count. For example, FIG. 2 presents a block diagram illustrating an example of counting the number of reference clock cycles in an input clock cycle during calibration according to some embodiments of the present disclosure. Moreover, FIG. 3 presents a drawing illustrating an example of counting the number of reference clock cycles in an input clock cycle during calibration with a reference clock according to some embodiments of the present disclosure. Note that in FIG. 2, there are 16 clock cycles of the reference clock withing one input clock cycle. Alternatively, in FIG. 3, the reference clock has a 75/25 duty cycle, and there are 12 clock cycles of the reference clock withing one input clock cycle.

A desired phase within the reference clock period may be generated by counting to a corresponding sub-count of the reference count. Note that the sub-count may be digitally adjusted to be a desired fraction of the reference clock period using digital division. Moreover, the gated ring oscillator may be used to sequentially: generate the reference count; create the sub-counts; and then gated off during unused portions of the reference clock cycle in order to save power. Thus, the gated ring oscillator may only be used when needed, and the generating circuit may be used to generate multiple clocks and/or duty cycles. In some embodiments, multiple clocks may be generated concurrently.

For example, after initialization/calibration, when a 75/25 duty cycle is desired, the corresponding sub-count may be obtained by dividing the reference clock period by 0.75. Then, the ring oscillator may be turned on until the reference count equals this sub-count, and may be subsequently turned off for the remainder of the reference clock cycle or period, thereby providing the 75/25 duty cycle.

Figure 4:
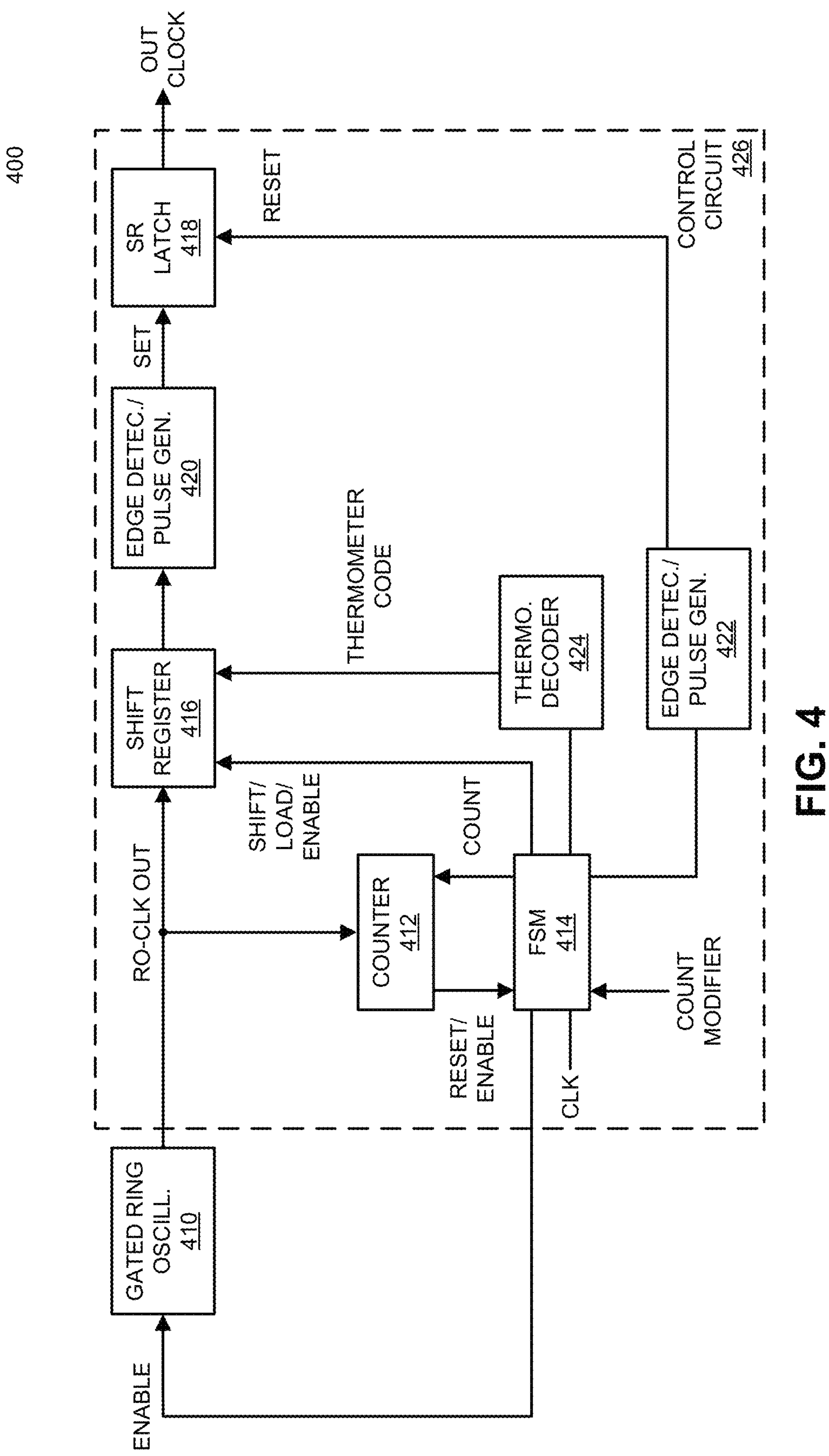
FIG. 4 is a block diagram illustrating an example of a generating circuit according to some embodiments of the present disclosure.

FIG. 4 presents a block diagram illustrating an example of a generating circuit 400 according to some embodiments of the present disclosure. Notably, a gated ring oscillator 410 in generating circuit 400 may provide a reference clock (RO-CLKOUT). A counter 412 may determine a desired reference count (COUNT), which is provided to a finite state machine (FSM) 414 or control logic, which may control gated ring oscillator 410 using an enable signal and counter 412 using reset and enable signals based at least in part on the input clock (CLK) and a desired phase or sub-count (corresponding to a count modifier). Moreover, FSM 414 may generate a given edge clock (CLK_OUT) by controlling (via shift, load and enable signals) a shift register 416 based at least in part on the reference count, and an SR latch 418 based at least in part on a reset signal provided by a first edge detect/pulse generating circuit 420. For example, FSM 414 may load a count into the shift register, and may used different points in the reference clock cycle as triggers for edge clocks. Note that an output of shift register 416 may be provided to a second edge detect/pulse generating circuit 422, which sets SR latch 418. In some embodiments, a thermometer decoder 424 (which refers to logic code) or unary coding may be used to facilitate faster detection of the ring oscillator edge count. Note that at least some of the components in generating circuit 400 may be included in control circuit 426.

In some embodiments, calibration of generating circuit 400 may only require a single reference-clock cycle or reference clock period of the reference clock, and a few more reference-clock cycles to set up a state machine. Because generating circuit 400 may not include a 'locking loop' of a DLL, it may reach operating status more rapidly than a DLL-based generating circuit.

Figure 5A:
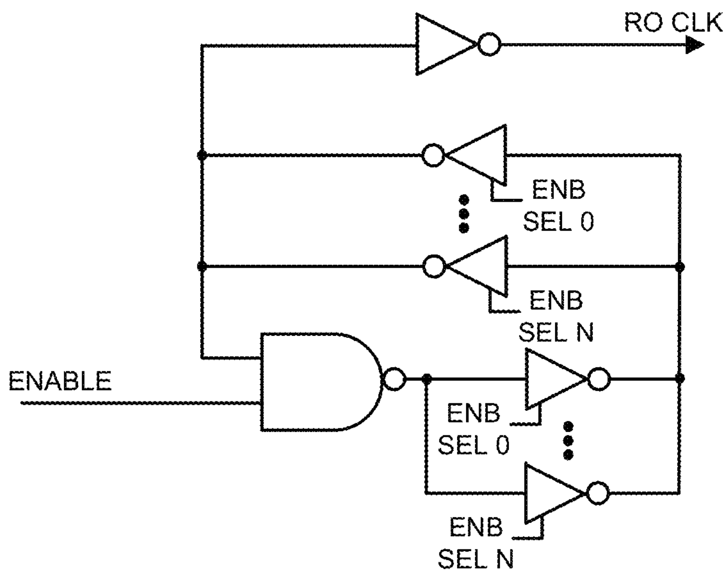
FIG. 5A is a block diagram illustrating an example of a digitally programmable ring oscillator according to some embodiments of the present disclosure.
Figure 5B:
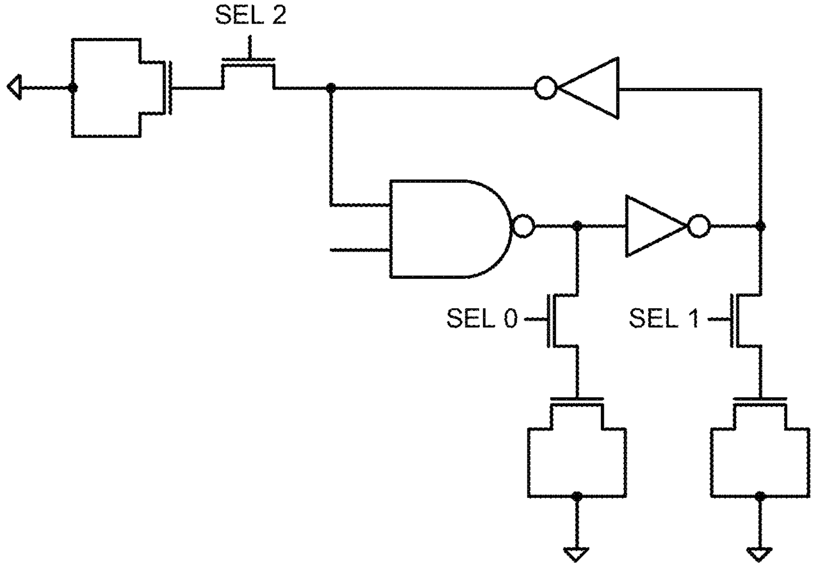
FIG. 5B is a block diagram illustrating an example of a digitally programmable ring oscillator according to some embodiments of the present disclosure.
Figure 5C:
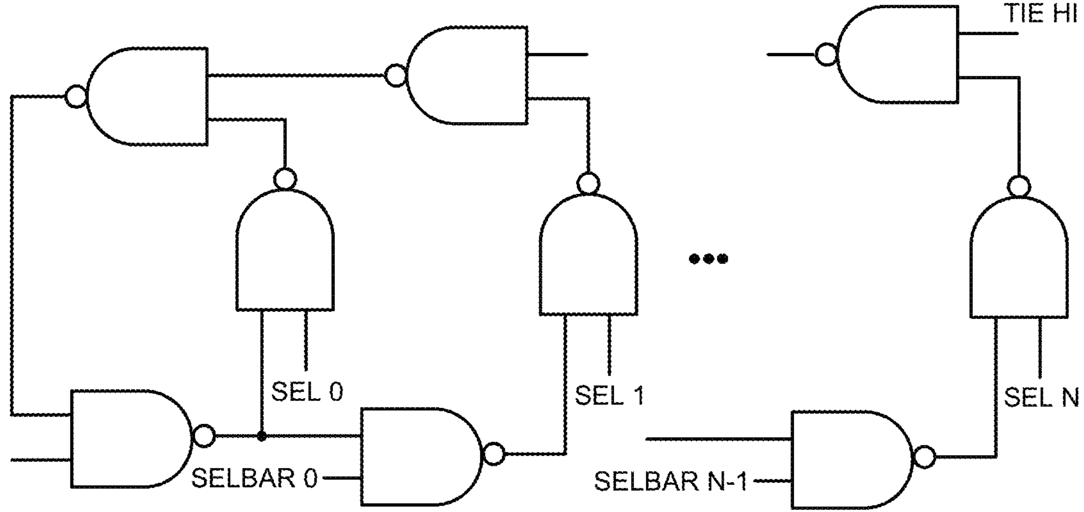
FIG. 5C is a block diagram illustrating an example of a digitally programmable ring oscillator according to some embodiments of the present disclosure.

Note that generating circuit 400 may calibrate out the effect of process variation, but may still be subject to the effects of voltage and temperature variation. In some embodiments, a programmable-length ring oscillator may be used to help keep the fundamental frequency of the reference clock within a nominal range over process at the cost of additional calibration cycles. In this way, the fundamental frequency may not be too slow (which may adversely impact the resolution) or too fast for FSM 414 or the control logic. This capability may allow generating circuit 400 to be digitally programmed to correct for process variation across a semiconductor die or an integrated circuit, and thus to obtain better resolution. FIGS. 5A-5C presents block diagrams illustrating examples of digitally programmable ring oscillators according to some embodiments of the present disclosure. These types of digitally programmable ring oscillators may include: a variable driver strength, a variable load (such as variable capacitive load on drivers), and/or a variable delay (length) element. Combinations of the two or more of these types of ring oscillators may be used in generating circuit 400 (FIG. 4), such as a ring oscillator with variable delay elements that each have a variable load, or with variable delay elements for coarse delay and variable loads for fine delay.

Alternatively or additionally, periodic recalibration may be used to track voltage or temperature if an electronic device or a system that uses generating circuit 400 (FIG. 4) has down time. However, the amount of down time may be minimal, because only a few reference-clock cycles may be needed. In some embodiments, when there is no down time, dual generating circuits may be used to ping pong between calibration and normal operating modes.

In some embodiments, ⅛th of a clock input cycle provided by generating circuit 400 (FIG. 4) may be used for a SAR ADC input track signal. Moreover, a rising edge target signal may be needed to mark the end of the SAR conversion that occurs before the SAR track signal. Thus, the target signal and the track signal may be generated using the disclosed calibrated-delay generating circuit (which may not be limited to single clock-edge generation).

In some embodiments, there may be 16-30 phases, which may determine the granularity (or the number of bits or resolution) of the digital conversion of a SAR ADC. However, the use of more ring-oscillator cycles may limit the speed of the conversion circuit. Alternatively or additionally, including more stages in the gated ring oscillator may specify the number of phases, as well as process, voltage and temperature variation of generating circuit 400 (FIG. 4).

While the preceding discussion of the circuit techniques illustrated the gated ring oscillator as being selectively turned on or off, in other embodiments the gated ring oscillator may not be turned off. Instead, a particular edge provided by the gated ring oscillator may be used to, e.g., obtain a duty cycle that is other than 50/50.

Moreover, while the preceding discussion uses a SAR ADC as an example, the disclosed circuit techniques may be used with another type of ADC, such as another type of interleaved ADC or a pipeline ADC. Alternatively, in other embodiments, the circuit techniques may be used in an application (including an application without an ADC) to generate clocks with different duty cycles and phases.

In the present discussion, the analog-to-digital conversion performed using the edge clock provided by generating circuit 400 (FIG. 4) may be applied to a wide variety of input signals. For example, an input signal may include a frame. This frame may include an image, where one or more ADCs in the generating circuit may receive analog inputs corresponding to different spatial locations or regions. Alternatively, in some embodiments, such as in a scanning system, a frame may be progressively captured over a time interval (such as several milliseconds). Thus, in these embodiments, the one or more ADCs may receive analog inputs corresponding to different spatial locations or regions that are captured at different times.

Figure 6:
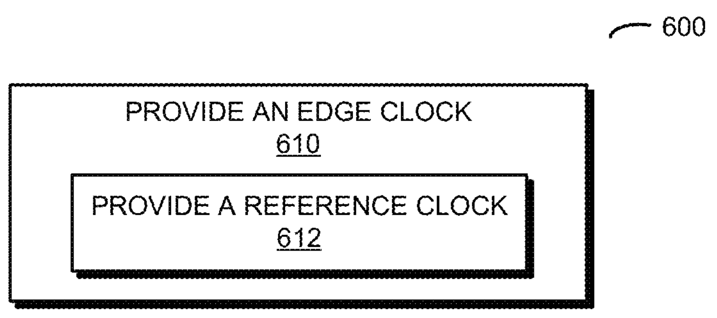
FIG. 6 is a flow diagram illustrating an example of a method for providing an edge clock according to some embodiments of the present disclosure.

We now describe embodiments of a method. FIG. 6 presents a flow diagram illustrating an example of a method 600 for providing an edge clock using a generating circuit, such as generating circuit 400 (FIG. 4). During operation, the generating circuit may provide the edge clock (operation 610) having a target phase within a clock period of an input clock, where the generating circuit does not include a DLL. Note that the providing (operation 610) may include: providing, using a gated ring oscillator, a reference clock (operation 612) having a first fundamental frequency that is larger than a second fundamental frequency of the input clock.

In some embodiments of the method 600, there may be additional or fewer operations. Moreover, the order of the operations may be changed, and/or two or more operations may be combined into a single operation.

The disclosed generating circuit and the circuit techniques can be (or can be included in) any electronic device. For example, the electronic device may include: a cellular telephone or a smartphone, a tablet computer, a laptop computer, a notebook computer, a personal or desktop computer, a netbook computer, a media player device, an electronic book device, a MiFi® device, a smartwatch, a wearable computing device, a portable computing device, a consumer-electronic device, an access point, a router, a switch, communication equipment, test equipment, a vehicle, a ship, an airplane, a car, a truck, a bus, a motorcycle, manufacturing equipment, farm equipment, construction equipment, or another type of electronic device.

Although specific components are used to describe the embodiments of the generating circuit and/or the integrated circuit that includes the generating circuit, in alternative embodiments different components and/or subsystems may be present in the generating circuit, the integrated circuit that includes the generating circuit, and/or the one or more ADCs. Thus, the embodiments of the generating circuit, the integrated circuit that includes the generating circuit, and/or the one or more ADCs may include fewer components, additional components, different components, two or more components may be combined into a single component, a single component may be separated into two or more components, one or more positions of one or more components may be changed, and/or there may be different types of components.

Moreover, the circuits and components in the embodiments of the generating circuit, the integrated circuit that includes the generating circuit, and/or the one or more ADCs may be implemented using any combination of analog and/or digital circuitry, including: bipolar, PMOS and/or NMOS gates or transistors. Furthermore, signals in these embodiments may include digital signals that have approximately discrete values and/or analog signals that have continuous values. Additionally, components and circuits may be single-ended or differential, and power supplies may be unipolar or bipolar. Note that electrical coupling or connections in the preceding embodiments may be direct or indirect. In the preceding embodiments, a single line corresponding to a route may indicate one or more single lines or routes.

As noted previously, an integrated circuit may implement some or all of the functionality of the circuit techniques. This integrated circuit may include hardware and/or software mechanisms that are used for implementing functionality associated with the circuit techniques.

In some embodiments, an output of a process for designing the integrated circuit, or a portion of the integrated circuit, which includes one or more of the circuits described herein may be a computer-readable medium such as, for example, a magnetic tape or an optical or magnetic disk. The computer-readable medium may be encoded with data structures or other information describing circuitry that may be physically instantiated as the integrated circuit or the portion of the integrated circuit. Although various formats may be used for such encoding, these data structures are commonly written in: Caltech Intermediate Format (CIF), Calma GDS II Stream Format (GDSII), Electronic Design Interchange Format (EDIF), OpenAccess (OA), or Open Artwork System Interchange Standard (OASIS). Those of skill in the art of integrated circuit design can develop such data structures from schematic diagrams of the type detailed above and the corresponding descriptions and encode the data structures on the computer-readable medium. Those of skill in the art of integrated circuit fabrication can use such encoded data to fabricate integrated circuits that include one or more of the circuits described herein.

While some of the operations in the preceding embodiments were implemented in hardware or software, in general the operations in the preceding embodiments can be implemented in a wide variety of configurations and architectures. Therefore, some or all of the operations in the preceding embodiments may be performed in hardware, in software or both. For example, at least some of the operations in the circuit techniques may be implemented using program instructions that are executed by a processor or in firmware in an integrated circuit.

Moreover, while examples of numerical values are provided in the preceding discussion, in other embodiments different numerical values are used. Consequently, the numerical values provided are not intended to be limiting.

In the preceding description, we refer to 'some embodiments.' Note that 'some embodiments' describes a subset of all of the possible embodiments, but does not always specify the same subset of embodiments.

The foregoing description is intended to enable any person skilled in the art to make and use the disclosure, and is provided in the context of a particular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. Additionally, the discussion of the preceding embodiments is not intended to limit the present disclosure. Thus, the present disclosure is not intended to be limited to the embodiments shown, but is to be accorded the widest scope consistent with the principles and features disclosed herein.

What is claimed is:

1. An integrated circuit, comprising:

a generating circuit comprising a gated ring oscillator, wherein the generating circuit is configured to provide an edge clock having a target phase within a clock period of an input clock and a having duty cycle, wherein the generating circuit does not include a delay locked loop (DLL), and wherein the duty cycle is other than 50/50 and the generating circuit is configured to provide the edge clock having the duty cycle by selectively turning the gated ring oscillator on and off based at least in part on a control signal.

2. The integrated circuit of claim 1, wherein the gated ring oscillator is configured to provide a reference clock having a first fundamental frequency that is larger than a second fundamental frequency of the input clock.

3. The integrated circuit of claim 2, wherein the gated ring oscillator is configured to be programmed to adjust the first fundamental frequency within a predefined range of values.

4. The integrated circuit of claim 2, wherein the generating circuit comprises a control circuit configured to determine a reference count of a number of edges of the reference clock within a reference period of the reference clock.

5. The integrated circuit of claim 4, wherein the control circuit is configured to provide the control signal corresponding to the target phase based at least in part on a predefined sub-count of the reference count.

6. The integrated circuit of claim 5, wherein the predefined sub-count is programmable or adjustable.

7. The integrated circuit of claim 5, wherein the control circuit is configured to compute the predefined sub-count by digitally dividing the reference count by a predefined value.

8. The integrated circuit of claim 1, wherein the generating circuit is configured to concurrently generate multiple edge clocks having different target phases in the clock period.

9. The integrated circuit of claim 1, wherein the generating circuit is periodically calibrated.

10. The integrated circuit of claim 1, wherein the integrated circuit comprises a second generating circuit; and wherein, when the generating circuit is calibrated, the second generating circuit is operated in a normal operating mode and, when the second generating circuit is calibrated, the generating circuit is operated in a normal operating mode.

11. The integrated circuit of claim 1, wherein the integrated circuit comprises an analog-to-digital converter (ADC) that is configured to use the edge clock to convert a second input signal into a quantized output.

12. The integrated circuit of claim 11, wherein the ADC comprises a successive-approximation-register (SAR) ADC.

13. A system, comprising:

an integrated circuit, comprising a generating circuit comprising a gated ring oscillator, wherein the generating circuit is configured to provide an edge clock having a target phase within a clock period of an input clock and a having duty cycle, wherein the generating circuit does not include a delay locked loop (DLL), and wherein the duty cycle is other than 50/50 and the generating circuit is configured to provide the edge clock having the duty cycle by selectively turning the gated ring oscillator on and off based at least in part on a control signal.

14. The system of claim 13, wherein the gated ring oscillator is configured to provide a reference clock having a first fundamental frequency that is larger than a second fundamental frequency of the input clock.

15. The system of claim 14, wherein the generating circuit comprises a control circuit configured to determine a reference count of a number of edges of the reference clock within a reference period of the reference clock.

16. The system of claim 13, wherein the generating circuit is configured to concurrently generate multiple edge clocks having different target phases in the clock period.

17. The system of claim 13, wherein the integrated circuit comprises an analog-to-digital converter (ADC) that is configured to use the edge clock to convert a second input signal into a quantized output.

18. A method for providing an edge clock, comprising:

by a generating circuit:

providing the edge clock having a target phase within a clock period of an input clock and having a duty cycle, wherein the generating circuit comprises a gated ring oscillator, and wherein the generating circuit does not include a delay locked loop (DLL); and when the duty cycle is other than 50/50, providing the edge clock having the duty cycle by selectively turning the gated ring oscillator on and off based at least in part on a control signal.

19. The method of claim 18, wherein the providing comprises providing, using the gated ring oscillator, a reference clock having a first fundamental frequency that is larger than a second fundamental frequency of the input clock; and wherein the method comprises determining, using a control circuit, a reference count of a number of edges of the reference clock within a reference period of the reference clock.

20. The method of claim 18, wherein the generating circuit is configured to concurrently generate multiple edge clocks having different target phases in the clock period.

* * * * *